US011538522B1

(12) United States Patent
Mirichigni et al.

(10) Patent No.: US 11,538,522 B1
(45) Date of Patent: Dec. 27, 2022

(54) SYSTEMS AND METHODS FOR ADAPTIVE SELF-REFERENCED READS OF MEMORY DEVICES

(71) Applicant: Micron Technology, Inc., Boise, ID (US)

(72) Inventors: Graziano Mirichigni, Vimercate (IT); Corrado Villa, Sovico (IT)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 17/364,067

(22) Filed: Jun. 30, 2021

(51) Int. Cl.
*G11C 7/14* (2006.01)
*G11C 16/28* (2006.01)
*G11C 13/00* (2006.01)

(52) U.S. Cl.
CPC ........ *G11C 13/004* (2013.01); *G11C 13/0026* (2013.01); *G11C 13/0028* (2013.01); *G11C 2013/0045* (2013.01)

(58) Field of Classification Search
CPC .............. G11C 13/004; G11C 13/0026; G11C 13/0028; G11C 2013/0045; G11C 16/20–28; G11C 7/10–14
See application file for complete search history.

(56) References Cited

U.S. PATENT DOCUMENTS

| 10,431,301 B2 | 10/2019 | Mirichigni et al. |
| 10,566,052 B2 | 2/2020 | Mirichigni et al. |
| 10,600,480 B2 | 3/2020 | Mirichigni et al. |
| 2006/0158948 A1* | 7/2006 | Fuji ..................... G11C 13/0069 365/222 |
| 2013/0080858 A1* | 3/2013 | Lee ...................... G11C 11/5642 714/E11.054 |
| 2017/0300252 A1* | 10/2017 | Yim ....................... G11C 29/52 |
| 2019/0087125 A1* | 3/2019 | Matsumoto ........... G06F 3/0653 |
| 2020/0201726 A1* | 6/2020 | Lee ....................... G11C 29/021 |

FOREIGN PATENT DOCUMENTS

WO     2020/020035     7/2020

OTHER PUBLICATIONS

U.S. Appl. No. 17/364,029, filed Jun. 30, 2021, Graziano Mirichigni.

* cited by examiner

*Primary Examiner* — Hien N Nguyen
(74) *Attorney, Agent, or Firm* — Fletcher Yoder, P.C.

(57) ABSTRACT

Methods and systems include memory devices with a memory array comprising a plurality of memory cells. The memory devices include a control circuit operatively coupled to the memory array and configured to receive a read request for data and to apply a first voltage to the memory array based on the read request. The control circuit is additionally configured to count a total number of the plurality of memory cells that have switched to an active read state based on the first voltage and to apply a second voltage to the memory array based on the total number. The control circuit is further configured to return the data based at least on bits stored in a first and a second set of the plurality of memory cells.

20 Claims, 13 Drawing Sheets

SYSTEMS AND METHODS FOR ADAPTIVE SELF-REFERENCED READS OF MEMORY DEVICES

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Some memory devices include memory cells that may be accessed by turning on a transistor that couples the memory cell (e.g., a capacitor) with a wordline or a bitline. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of a threshold-type memory cell may be a cross-point memory cell.

With threshold-type memories, wordlines and bitlines are used to transmit selection signals to respective memory cells. The selection signals may include signals characterized by voltage levels used to save data into or retrieve data from the memory cells. The wordlines and bitlines may couple to selection signal sources through drivers. The memory cells may be organized into one or more layers of memory cells, such as layers defined between overlapping wordlines and bitlines. These layers may be referred to as decks (e.g., memory decks). Various combinations of the wordlines, bitlines, and/or decoders may be referenced for use in a particular memory operation using addresses (e.g., memory addresses). The address may indicate which memory cell is to be selected using a combination of signals from the wordlines, bitlines, and/or decoders, and a particular value of the address may be based on ranges of addresses of the memory device. As may be appreciated, some memory cells at some intersections of the wordlines and bitlines may be farther from drivers than other memory cells at other intersections. To cause memory cells at various distances to be turned on from the respective decoders, the memory device may utilize one or more step voltages. It may be beneficial to improve read techniques for threshold-type memories.

BRIEF DESCRIPTION OF THE DRAWINGS

Various aspects of this disclosure may better be understood upon reading the following detailed description and upon reference to the drawings in which.

DETAILED DESCRIPTION

Figure 1:
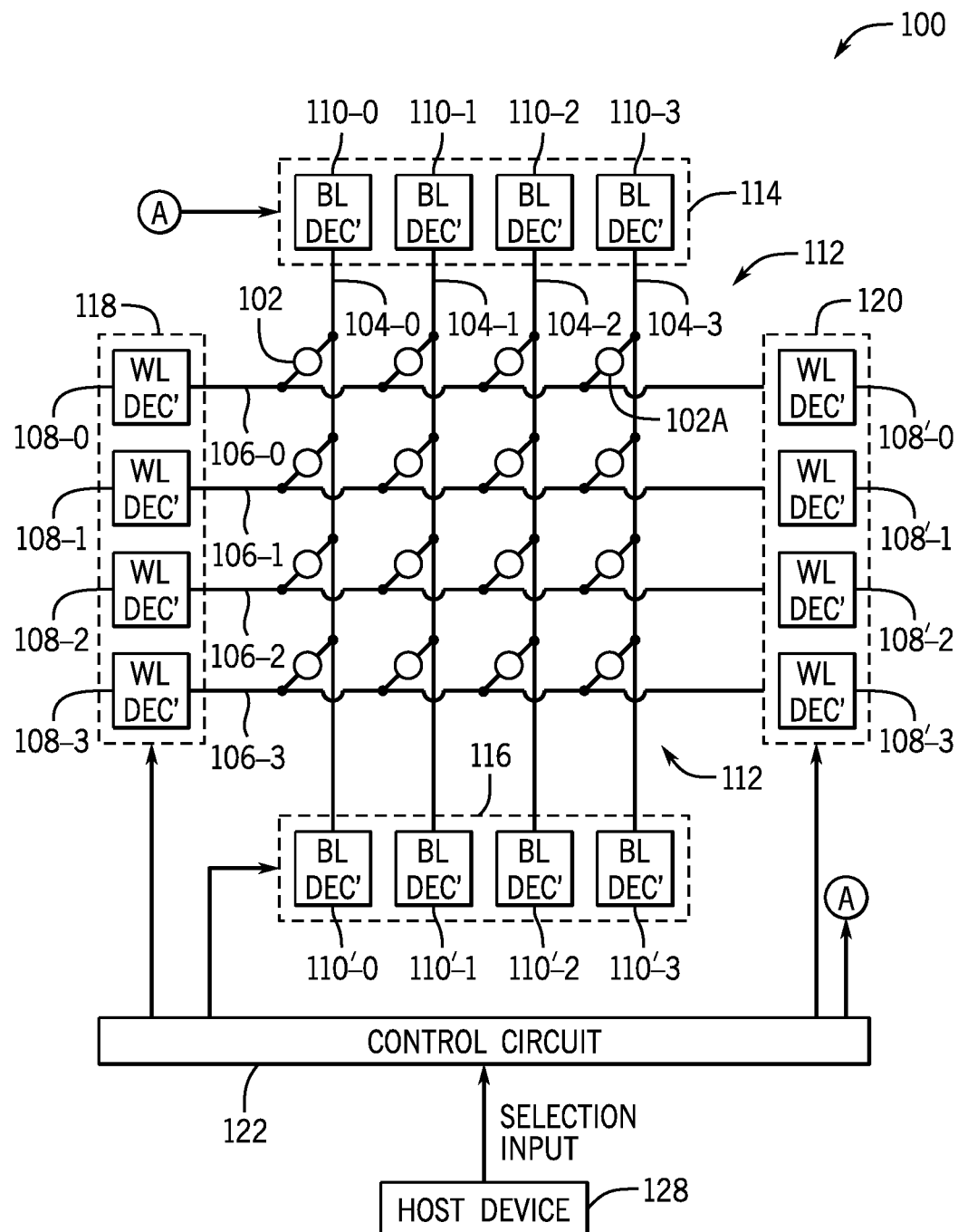
FIG. 1 is a simplified block diagram illustrating certain features of a memory device including a memory array of memory cells, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells, where each memory cell is coupled between at least two access lines. For example, a memory cell may be coupled to access lines, such as a bitline and a wordline. Each access line may be coupled to a large number of memory cells. To select a memory cell, one or more drivers may provide selection signals (e.g., a voltage and/or a current) on the access lines to access storage capacities of the memory cell. By applying voltages and/or currents to the respective access lines, the memory cell may be accessed, such as to write data to the memory cell and/or read data from the memory cell.

In some memories, memory cells of the array may be organized into decks of memory cells. A deck of memory cells may be a single plane of memory cells disposed between a layer of wordlines and a layer of bitlines. The array may be a stack of decks that includes any number of decks of memory cells (e.g., 1 deck, 2 decks, 4 decks, any number of decks) as different layers of the array.

In some embodiments, a logic state of 1 (e.g., a SET state of a memory cell, which may also be referred to as a SET cell or bit) may correspond to a set of threshold voltages lower than a set of threshold voltages associated with a logic state of 0 (e.g., a RESET state of a memory cell, which may also be referred to as a RESET cell or bit). Accordingly, a lower voltage may be used to read SET cells when compared to RESET cells. An adaptive read technique may include application of a voltage (e.g., a read voltage) to a memory array that is configured to activate a group of memory cells containing encoded user data. In some embodiments, the read voltage may have a constant rate of increase with respect to time, e.g., exhibiting a ramp shape. In other embodiments, the read voltage may have an increasing staircase shape such that a first voltage is applied for a first period of time followed by a second different voltage for a second period of time, and so on.

The applied voltage may initiate a series of switching events by activating the group of memory cells storing the encoded user data. The switching event may be attributed to a memory cell turning on (e.g., conducting an appreciable amount of current) when the applied voltage across the memory cell exceeds its threshold voltage (VTH). Hence, initiating the series of switching events in response to the increasing read voltage may be similar to identifying memory cells in an ascending order in terms of their threshold voltage values.

The adaptive read techniques described herein may derive a more optimal number of steps, a more optimal voltage for a step (e.g., start voltage), and/or a more optimal time duration for each step. In certain embodiments, statistical assumptions based on SET cell distributions such as a minimum, a mean, a sigma, and the like, may be used to derive a staircase shape that may start from a more optimal voltage and apply an adaptively derived number of steps. Additionally or alternatively, the step duration may also be adaptively derived, based on, for example, a number of cells that are turning on at a given step. For example, a step may be turned on for a longer duration if there are memory cells still turning on when compared to a step that has less memory cells that turn on the given voltage.

Indeed, the embodiments described herein may be used to adaptively adjust a number of steps to be used during read operations. In one example, a lookup table (LUT) may be used to determine a zone or area to use for a step to follow. That is, the first zone or area may determine a next zone or area, and so on, until a number of steps are derived adaptively. Likewise, voltage levels may be determined. By adaptively deriving a total number of steps and/or adaptively determining voltages for each step, the techniques described herein may more efficiently read data from certain memory devices.

Turning now to the figures, FIG. 1 is a block diagram of a portion of a memory device 100. The memory device 100 may be any suitable form of memory, such as non-volatile memory (e.g., a cross-point memory) and/or volatile memory. The memory device 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each of the memory cells 102 may not include a separate selector and storage element, and have a configuration such that the memory cell nonetheless acts as having a selector and storage element (e.g., may include use of a material that behaves both like a selector material and a storage element material). For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell 102. Furthermore, the memory device 100 may include other circuitry, such as a biasing circuitry configured to bias the bitlines 104 or wordlines 106 in a corresponding direction. For example, the bitlines 104 may be biased with positive biasing circuitry while the wordlines 106 may be biased with negative biasing circuitry.

The bitline decoders 110 may be organized in multiple groups of decoders. For example, the memory device 100 may include a first group of bitline decoders 114 (e.g., multiple bitline decoders 110) and/or a second group of bitline decoders 116 (e.g., different group of multiple bitline decoders 110). Similarly, the wordline decoders 108 may also be arranged into groups of wordline decoders 108, such as a first group of wordline decoders 118 and/or a second group of wordline decoders 120. Decoders may be used in combination with each other to drive the memory cells 102 (e.g., such as in pairs and/or pairs of pairs on either side of the wordlines 106 and/or bitlines 104) when selecting a target memory cell 102A from the memory cells 102. For example, bitline decoder 110-3 may operate in conjunction with bitline decoder 110'-3 and/or with wordline decoders 108-0, 108'-0 to select the memory cell 102A. As may be appreciated herein, decoder circuitry on either ends of the wordlines 106 and/or bitlines 104 may be different.

Each of the bitlines 104 and/or wordlines 106 may be metal traces disposed in the memory array 112, and formed from metal, such as copper, aluminum, silver, tungsten, or the like. Accordingly, the bitlines 104 and the wordlines 106 may have a uniform resistance per length and a uniform parasitic capacitance per length, such that a resulting parasitic load may uniformly increase per length. It is noted that the depicted components of the memory device 100 may include additional circuitry not particularly depicted and/or may be disposed in any suitable arrangement. For example, a subset of the wordline decoders 108 and/or bitline decoders 110 may be disposed on different sides of the memory array 112 and/or on a different physical side of any plane including the circuitries.

The memory device 100 may also include a control circuit 122. The control circuit 122 may communicatively couple to respective of the wordline decoders 108 and/or bitline decoders 110 to perform memory operations, such as by causing the decoding circuitry (e.g., a subset of the wordline decoders 108 and/or bitline decoders 110) to generate selection signals (e.g., selection voltage and/or selection currents) for selecting a target of the memory cells. In some embodiments, a positive voltage and a negative voltage may be provided on one or more of the bitlines 104 and/or wordlines 106, respectively, to a target of the memory cells 102. In some embodiments, the decoder circuits may provide biased electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse to the target of the memory cells 102 such that the control circuit 122 is able to access data storage of the target memory cell, such as to read from or write to the data storage. After a target of the memory cells 102 is accessed, data stored within storage medium of the target memory cell may be read or written. Writing to the target memory cell may include changing the data value stored by the target memory cell. As previously discussed, the data value stored by a memory cell may be based on a threshold voltage of the memory cell. In some embodiments, a memory cell may be "set" to have a first threshold voltage or may be "reset" to have a second threshold voltage. A SET memory cell may have a lower threshold voltage than a RESET memory cell. By setting or resetting a memory cell, different data values may be stored by the memory cell. Reading a target of the memory cells 102 may include determining whether the target memory cell was characterized by the first threshold voltage and/or by the second threshold voltage. In this way, a threshold voltage window may be analyzed to determine a value stored by the target of the memory cells 102. The threshold voltage window may be created by applying programming pulses with opposite polarity biasing to the memory cells 102 (e.g., in particular, writing to selector device (SD) material of the memory cell) and reading the memory cells 102 (e.g., in particular, reading a voltage stored by the SD material of the memory cell 102) using a signal with a given (e.g., known) fixed polarity. In some embodiments, a selection input may be received from a host device 128, such as a host processor reading data from the memory device 100 to cause the control circuit 122 to access particular memory cells 102.

The control circuit 122 may additionally adaptively read data from the memory cells 102, for example, by applying a voltage in a certain pattern (e.g., staircase, ramp) to activate a group of memory cells storing data (e.g., encoded data). The voltage may be applied via bitlines 104 and wordlines 106. The applied read voltage may then cause an activation event (e.g., switching event) readable via the wordline decoders 108 and the bitline decoders 110. SET cells may activate at a first voltage threshold (Vth) lower than a second Vth of RESET cells. The voltage thresholds of the SET cells may be included in a first bell curve shape, while the voltage thresholds of the RESET cells may be included in a second bell curve shape. The first bell curve shape may not overlap the second bell curve shape. That is, all voltage thresholds in the first bell curve shape may be lower than any one of the voltage thresholds in the second voltage shape.

In certain embodiments, statistical assumptions based on cell distributions such as a minimum, a mean, a sigma, and the like, may be used to derive a staircase shape used to apply a read voltage to the array 112. The staircase shape may start from a more optimal voltage greater than 0 volts and apply an adaptively derived number of staircase steps. Additionally or alternatively, the step duration may also be adaptively derived, based on, for example, a number of cells that are turning on at a given step.

Figure 2:
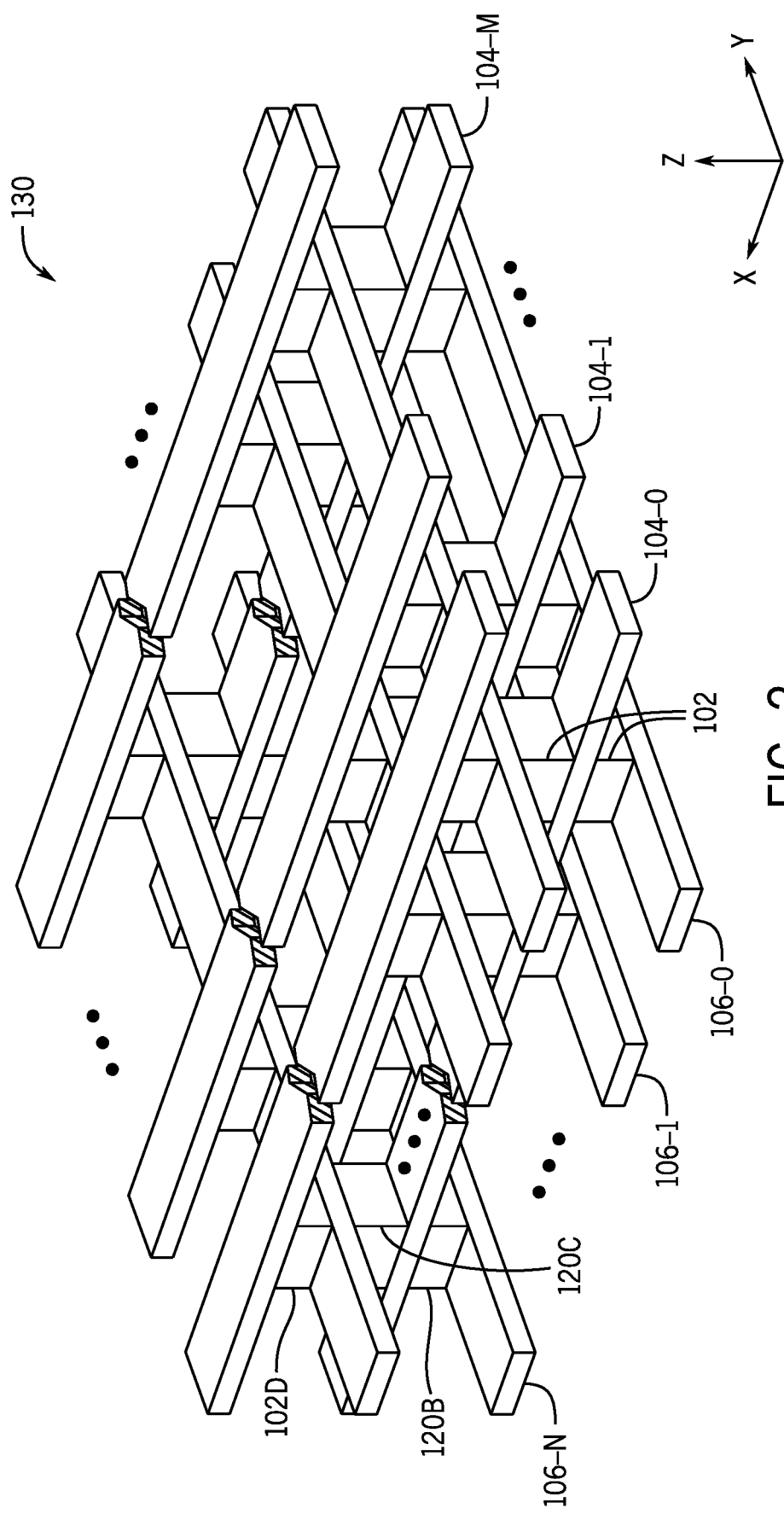
FIG. 2 is a side-view of a diagram illustrating the portion of the memory array of FIG. 1, according to an embodiment of the present disclosure.

FIG. 2 is a diagram illustrating a portion of a memory array 130 in accordance with an embodiment of the present disclosure. Inside the memory array 130, the memory cells are located at intersections of certain lines (e.g., orthogonal lines). The memory array 130 may be a cross-point array including wordlines 106 (e.g., 106-0, 106-1, . . . , 106-N) and bitlines 104 (e.g., 104-0, 104-1, . . . , 104-M). A memory cell 102 may be located at each of the intersections of the wordlines 106 and bitlines 104. The memory cells 102 may function in a two-terminal architecture (e.g., with a particular wordline 106 and the bitline 104 combination serving as the electrodes for the memory cell 102).

Each of the memory cells 102 may be resistance variable memory cells, such as resistive random-access memory (RRAM) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a selector device (SD) material) and/or a material layer that functionally replaces a separate memory element layer and selector element layer. The selector element (e.g., SD material) may be disposed between a wordline contact (e.g., a layer interface between a respective one of the wordlines 106 and the memory material) and a bitline contact (e.g., a layer interface between a respective one of the bitlines 104 and the selector element) associated with a wordline or bitline forming the memory cell. Electrical signals may transmit between the wordline contact and the bitline contact when reading or writing operations are performed to the memory cell.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 102 may include a memory portion of the memory cell 102 (e.g., the portion programmable to different states). For instance, in resistance variable memory cells 102, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current. For example, the current may be sensed on one or more bitlines 104/one or more wordlines 106 corresponding to the respective memory cells 102 in response to a particular voltage applied to the selected of the bitlines 104/wordlines 106 forming the respective memory cells 102.

As illustrated, the memory array 130 may be arranged in a cross-point memory array architecture (e.g., a three-dimensional (3D) cross-point memory array architecture) that extends in any direction (e.g., x-axis, y-axis, z-axis). The multi-deck cross-point memory array 130 may include a number of successive memory cells (e.g., 102B, 102C, 102D) disposed between alternating (e.g., interleaved) decks of wordlines 106 and bitlines 104. The number of decks may be expanded in number or may be reduced in number and should not be limited to the depicted volume or arrangement. Each of the memory cells 102 may be formed between wordlines 106 and bitlines 104 (e.g., between two access lines), such that a respective one of the memory cells 102 may be directly electrically coupled with (e.g., electrically coupled in series) with its respective pair of the bitlines 104 and wordlines 106 and/or formed from electrodes (e.g., contacts) made by a respective portion of metal of a respective pair of bitlines 104 and wordlines 106. For example, the memory array 130 may include a three-dimensional matrix of individually-addressable (e.g., randomly accessible) memory cells 102 that may be accessed for data operations (e.g., sense and write) at a granularity as small as a single storage element and/or multiple storage elements. In some cases, the memory array 130 may include more or fewer bitlines 104, wordlines 106, and/or memory cells 102 than shown in the examples of FIG. 2. Each deck may include one or more memory cells 102 aligned in a same plane.

Figure 3:
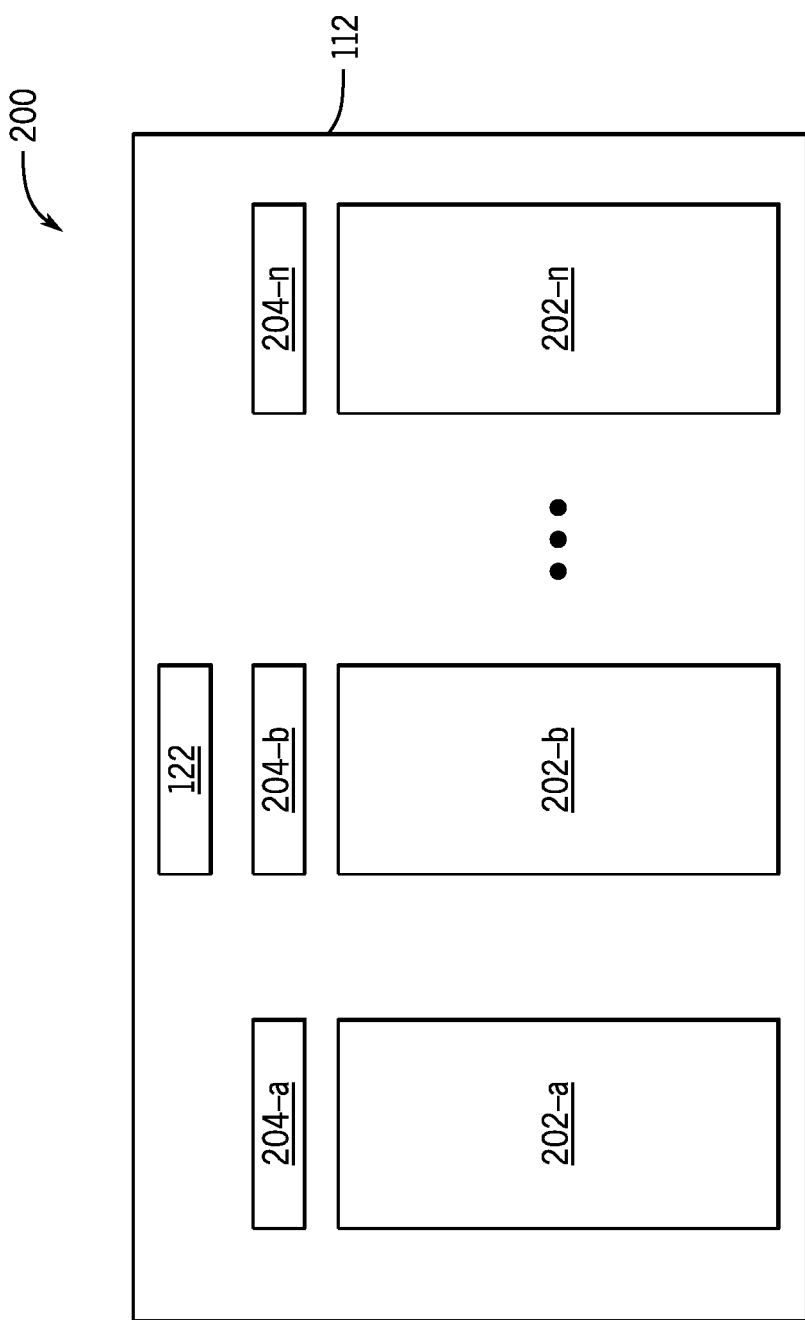
FIG. 3 is a block diagram of an embodiment of the memory device of FIG. 1 where the memory array has been partitioned into multiple partitions, according to an embodiment of the present disclosure.

FIG. 3 is a block diagram of an embodiment of a memory device 200 where the memory array 112 has been partitioned into multiple partitions 202 (e.g., partitions 202-a, 202-b . . . 202-n). Each partition 202 may include an associated local control circuit 204 (e.g., local control circuit 204-a, 204-b . . . 204-n). In some embodiments, the local control circuit 204 may be included in the control circuit 122 or interface with the control circuit 122. Accordingly, each partition 202 may operate independent from other partitions 202, which may enable parallel reads and writes of the memory array 112.

In some embodiments, the memory array 112 is a 3 DXP memory array, and each individual partition 220 is a 1 Gigabyte partition. The memory device 200 may include 16 of the 1 Gigabyte partitions. In some examples, the memory within each partition 202 may be accessed with 16 bytes of granularity, thus providing 26 bits of memory address information to memory array 110. Further, four bits can be used in this example to provide partition identification. It is to be noted that the particular partition sizes, number of partitions, and bits used for the commands and address operations described above are provided as examples only, and in other embodiments different partition sizes, numbers of partitions, and command/address bits may be used.

Figure 4:
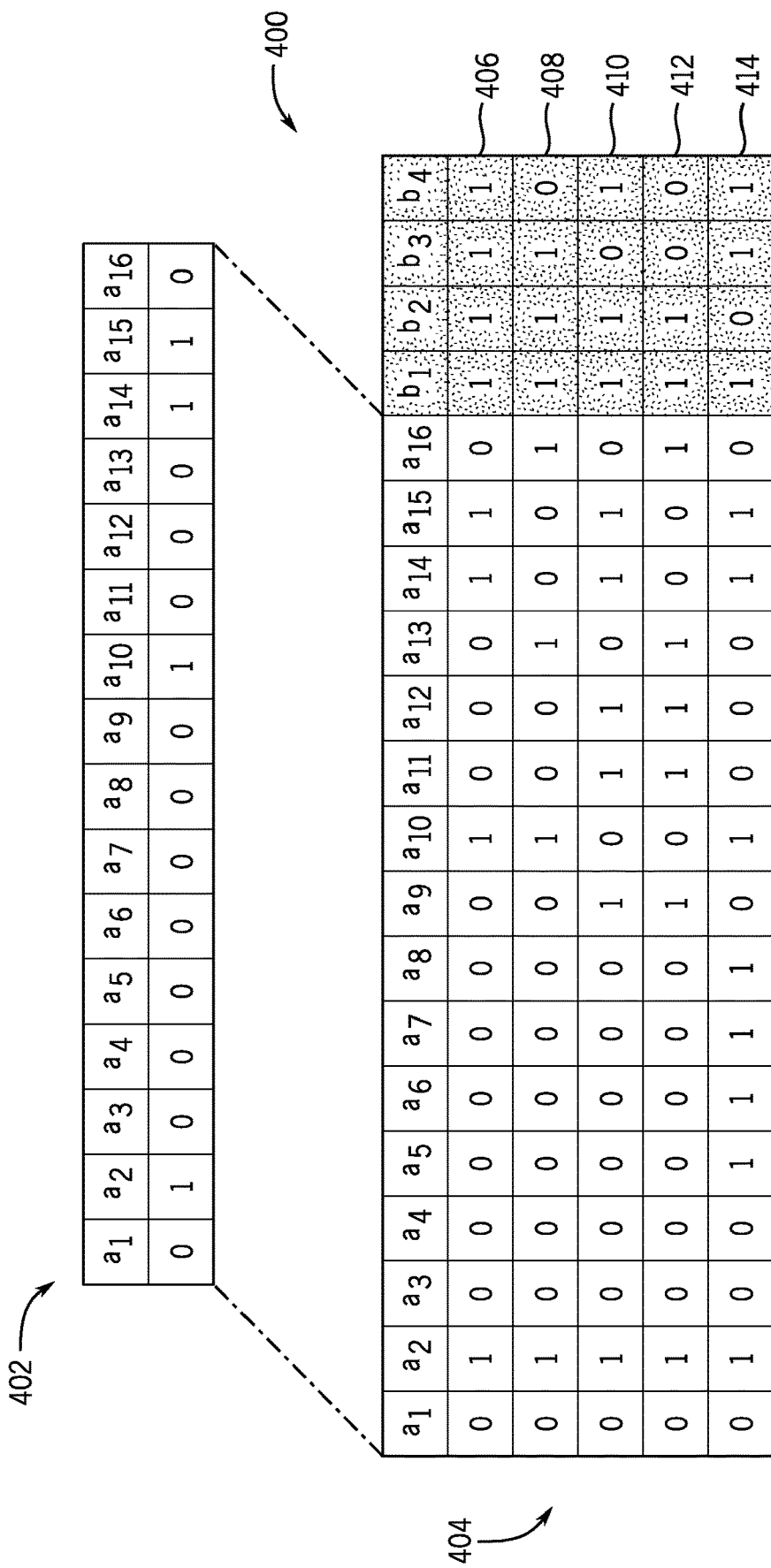
FIG. 4 is a block diagram of a user data pattern encoding, according to an embodiment of the present disclosure.

In some embodiments, the data stored in the memory array 112 may be encoded, for example, by adding certain encoding bits. The encoding data bits may enable faster reads, as further described below. Turning now to FIG. 4, the figure illustrates an embodiment of a user data pattern 400 that may be used by the adaptive read techniques described herein. The user data pattern 400 illustrates a non-encoded user data 402 which may then be encoded as a user data 404. The non-encoded user data 402 may be referred to as an input vector in some cases. The encoded user data 404 may include additional bits (e.g., b1 through b4). The additional bits may be referred to as flip-bits and may indicate a status of the user data, as described below.

The adaptive read may include an encoding technique for generating an encoded user data having a weight (e.g., a number of bits having the logic state of 1 out of a total number of bits in the user data) within a predetermined interval. In some embodiments, the interval is 50% through (50+50/k)% where k is a predetermined factor further described below. In some cases, the interval is expressed as [50%, (50+50/k)%]. For example, when k is equal to 4, the interval may be 50% to 62.5% (e.g., [50%, 62.5%]), 40% to 70%. A different weight other than 50% as a lower bound of the interval may be used. Illustrations in FIG. 4 refer to 50% as a lower bound of the interval for a more concise description of the depicted features; however, other alternatives and different variations may be contemplated and fall within the scope of this disclosure.

By way of example, the user data 402 is shown as having 16 bits (e.g., a1 through a16). In a case in which k is equal to 4, the predetermined interval for the encoded user data to meet may be of [50%, 62.5%]. Various forms of the encoded user data 404, when k=4, are illustrated in FIG. 4. The encoding technique may add k number of flip-bits (e.g., b1 through b4 when k=4) to the user data 402 (e.g., a1 through a16) to generate the encoded user data 404. In addition, the original user data pattern may be partitioned into k number of portions (e.g., four portions or segments when k=4). For example, a first portion may include bits a1 through a4. The first portion may be associated with a first flip bit, b1. A second portion may include bits a5 through a8. The second portion may be associated with the second flip bit, b2. A third portion may include bits a9 through a12. The third portion may be associated with the third flip bit, b3. A fourth portion may include bits a13 through a16. The fourth portion may be associated with the fourth flip bit, b4. In some embodiments, initial values of b1 through b4 correspond to the logic state of 1 (e.g., 1111 of the encoded user data pattern 406). The logic state of 1 in the flip-bits may indicate that corresponding portions of the original user data are not inverted. Conversely, the logic state of 0 in the flip-bits may indicate that corresponding portions of the original user data are inverted.

As described above, the adaptive read techniques described herein may determine a weight of the encoded user data pattern 404 as a percentage (e.g., adding the logic 1 bits and dividing the sum by the total number of unencoded bits). For example, the encoded user data 560-a has a weight of 25% (e.g., 4 bits having the logic state of 1 out of 16 bits in the user data), which does not meet the predetermined interval of [50%, 62.5%] when k=4. Further, the encoding technique may vary the logic states of the flip-bits throughout all possible combinations of logic states of the flip-bits to find a particular encoded user data that has a particular weight within the predetermined interval (e.g., an interval of [50%, 62.5%] when k=4). When there are k flip-bits (e.g., k=4), there are a total of 2^k (e.g., 2^4=16) combinations, such as 1111, 1110, 1101, 1100, . . . , 0001, and 0000.

When a logic state of a flip-bit corresponds to the logic state of 0, the adaptive read may invert the logic states of the corresponding portion of the user data and evaluate a weight. As illustrated, user data 406 does not include any inversions, and thus all flip-bits are set to 1. Inversion of data may then occur. By way of example, when the flip-bits are 1110 as shown in the encoded user data 408, the logic states of the fourth portion (e.g., bits a13 through a16) are inverted to 1001 from 0110. Then, the encoding technique may determine that the encoded user data pattern 408 has a weight of 25% (e.g., 4 bits having the logic state of 1 out of 16 bits in the user data), which does not meet the predetermined condition of the weight within the interval of [50%, 62.5%]. The encoding technique may restore the logic states of the fourth portion back to 0110 and vary the content of the flip-bits to a next combination (e.g., 1101 as shown in the encoded user data 410). The encoding technique may invert the logic states of the third portion (e.g., bits a9 through a12) to 1011 from 0100 as shown in the encoded user data 410 and determine that the encoded user data pattern 410 has a weight of 38% (e.g., 6 bits having the logic state of 1 out of 16 bits in the user data), which also does not meet the predetermined condition of the weight within the interval of [50%, 62.5%].

The adaptive read may continue varying the content of the flip-bits, inverting logical values of the bits of corresponding portions of the user data according to the flip-bits, and thereby evaluating weights of the encoded user data until an encoded user data meets the predetermined condition (e.g., the interval of [50%, 62.5%]). For example, the encoded user data 412 has a weight of 38% and does not meet the predetermined condition of [50%, 62.5%] weight interval. The encoded user data pattern 414 has the flip-bit contents of 1011 and the second portion of the user data (e.g., bits a5 through a8) are inverted to 1111 from 0000. The weight of the encoded user data 414 is 50% (e.g., 8 bits having the logic state of 1 out of 16 bits in the user data), which meets the predetermined condition of having the weight between [50%, 62.5%].

The coding technique may stop varying the content of the flip-bits based on determining that the encoded user data pattern 414 meets the predetermined condition and the coded user data pattern 414 may be stored in memory cells. The flip-bit contents (e.g., 1011) may then be used to decode the encoded user data when reading the encoded user data from the memory cells. For example, the logic states of bits a5 through a8 (e.g., 1111) of the encoded user data 414 may be inverted back to their original logic states (e.g., 0000) based on the value of the flip-bit, b2 (e.g., the logic state of 0 of b2 indicating the bits a5 through a8 having been inverted) when reading the encoded user data 414. By storing encoded bits at a desired weight range, the techniques described herein may more quickly read the data stored in the memory device 100.

Figure 5:
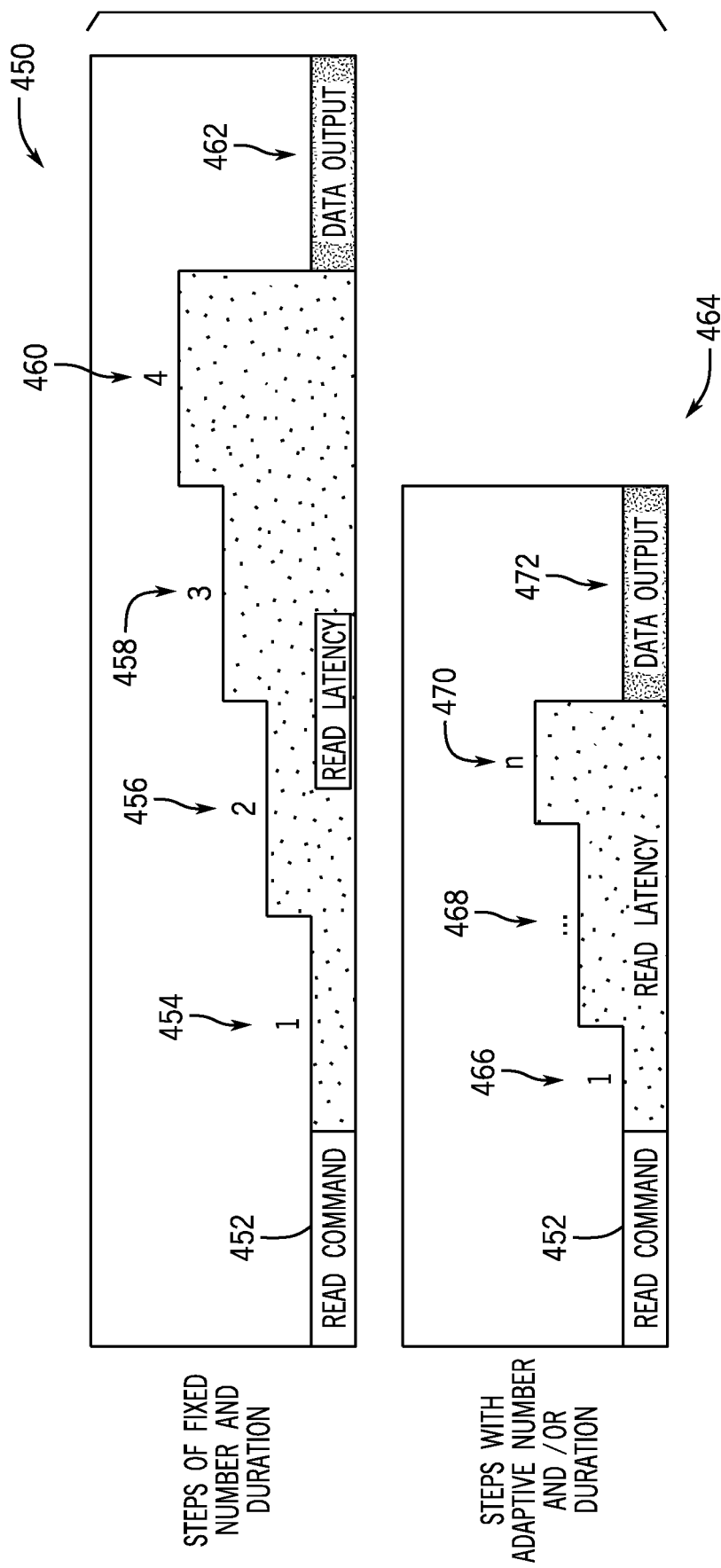
FIG. 5 is a block diagram illustrating two ramping shapes suitable for reading data for the memory array of FIG. 1, according to an embodiment of the present disclosure.

FIG. 5 is a block diagram illustrating embodiments of two ramping shapes that may be used to read data stored in the memory device 100. In the depicted embodiment, a first ramping shape (e.g., staircase shape) 450 is depicted, with an X axis representative of time and a Y axis representative of voltage. In the depicted embodiment, the ramping shape 450 includes four steps of fixed duration and number. A read command 452 may be received and the control circuit 122 may then initiate a first ramping step 454 to read data, for example, data 400. The first ramping step 454 may initiate a series of switching events in the memory cells 102 that may be storing, for example, data having a logic 1.

As mentioned earlier, the memory cells 102 storing the data may exhibit a bell curve distribution based on voltage. That is, the first ramping step 454 may not result in all memory cells 102 that store the logic 1 data exhibiting the switching behavior. Accordingly, additional voltage ramping may be applied. Further, the memory cells 102 that store logic 0 data may not exhibit the switching event until a voltage higher than that used to read all of the memory cells 102 storing logic 1 data is applied.

Accordingly, the first ramping shape 450 may result in three additional ramp steps 456, 458, 460 being applied to the memory cells 102 so as to read both the logic 1 data (e.g., SET cell data) and the logic 0 data (e.g., RESET cell data). In the depicted embodiment, each of the ramp steps 454, 456, 458 and 460 includes the same time t. That is, each ramp step 454, 456, 458 and 460 executes for a time duration of t. After the last ramp step 460 is used to apply read voltage, the control circuit 122 may then use data output 462 to decode into return data, for example, to be provided to devices connected to the memory device 100.

In some cases, the data stored may be read more efficiently. For example, the adaptive read techniques may use variable number of ramping steps and/or variable ramp timings, as shown in ramping shape 464. More specifically, the ramping shape 464 includes ramping steps 466, 468, and 470, each of which may have a time t1, t2, tN different from each other. Indeed, the techniques described herein may adaptively determine both the number of steps to use, as well as the time to apply voltage for each step, as further described below.

Figure 6:
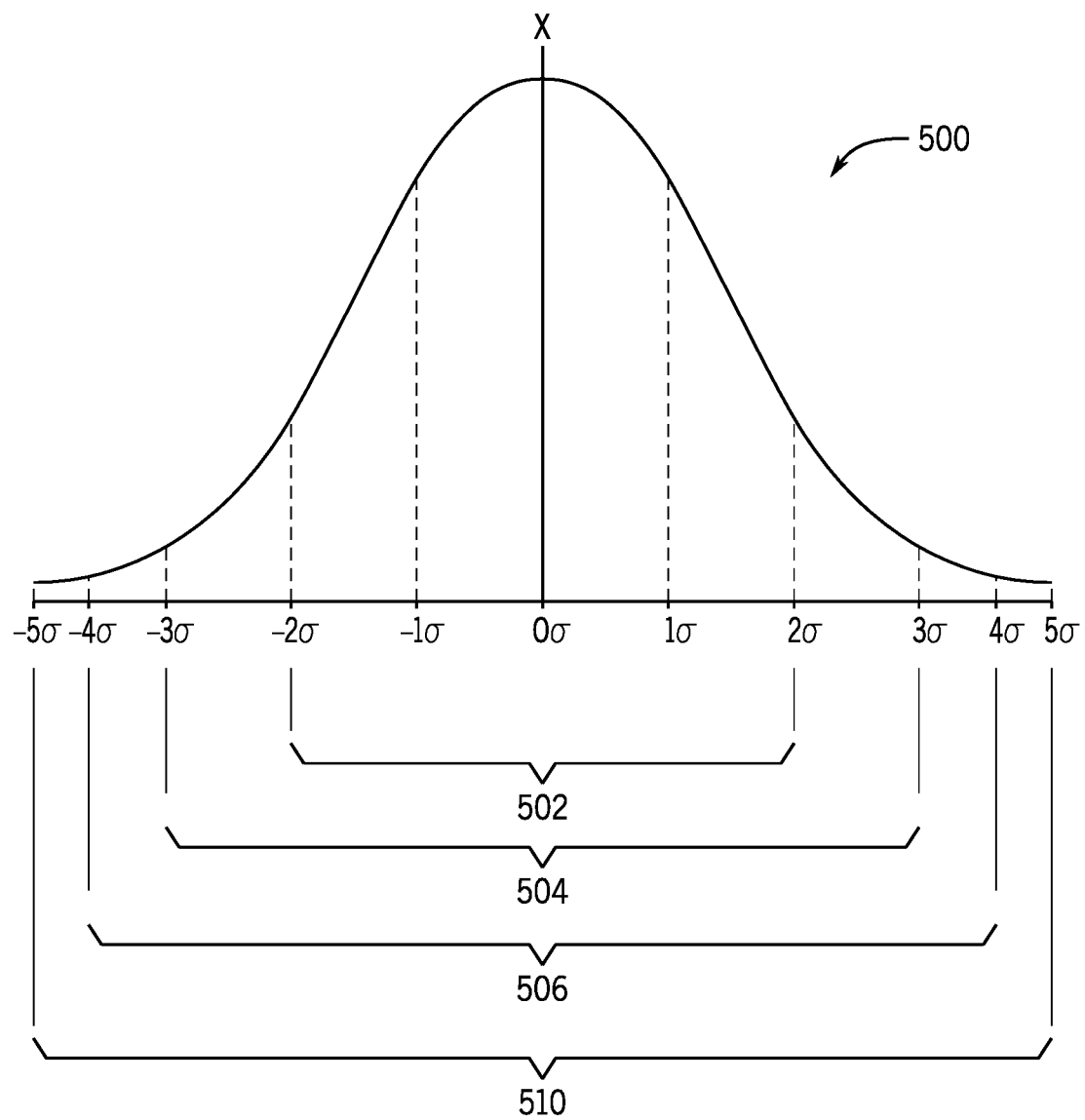
FIG. 6 is a graph of a bell curve distribution of bit data that may be stored in the memory array of FIG. 1, according to an embodiment of the present disclosure.

In certain embodiments, the techniques described herein may derive a distribution of SET cells and divide the SET distribution into multiple sigma regions (e.g., −5 sigma to +5 sigma) in slices (e.g., 1 sigma slices), as shown in FIG. 6. More specifically, the figure illustrates an example SET distribution 500 for data that has been encoded as described above with respect to FIG. 4, to arrive, for example, at a weight of between [50%, 62.5%]. The SET distribution is shown as having a statistical mean ($\overline{X}$), i.e., 0 sigma (0σ), with an X axis representative of a read voltage threshold (Vth) value and a Y axis representative of a number of SET memory cells 102 that exhibit the switching event at the given Vth. That is, a cell may switch at a given Vth, thus showing that it is storing a logic 1.

Due, for example, to the encoding scheme described above with respect to FIG. 4, approximately half (e.g., 50%) of the memory cells storing a logic 1 may thus exhibit the switching event at the mean voltage. That is, at X approximately half the SET memory cells 102 may have exhibited the switching event. The distribution 500 is further shown as having sigmas −5σ, −4σ, −3σ, −2σ, −1σ, +1σ, +2σ, +3σ, +4σ, +5σ where a sigma is one standard deviation away from the mean. Accordingly, +2σ is two standard deviations to the right of the mean, while −2σ is two standard deviations to the left of the mean, and so on. The standard deviation formula of $$\sigma = \sqrt{\frac{\sum(X-\overline{X})^2}{n-1}}$$

where X is a Vth value for a data point in the X axis of a memory cell 102 and n is the total number of data points may be used to find 1 σ or the first standard deviation and/or any other of the sigmas.

As illustrated, region 502 is inside of 1 sigma, region 504 is inside of 2 sigma, region 506 is inside of 3 sigma, region 508 is inside of 4 sigma, and region 510 is inside of 5 sigma. Points outside of region 510 may then be included inside of 6 sigma. For a 64 bit codeword, the SET distribution 500 may be derived via 256 (i.e., 64×4) data points (e.g., n=256) each data point (e.g., X) representative of a Vth for an individual SET memory cell 102 that stores a bit included in the codeword. The techniques described herein may adaptively define a ramping shape, such as the ramping shape 464, by using a statistical distribution, such as the SET distribution 500, to determine certain characteristics of the ramping shape (e.g., number of steps, voltages for a step, length of a step), as further described below.

Figure 7:
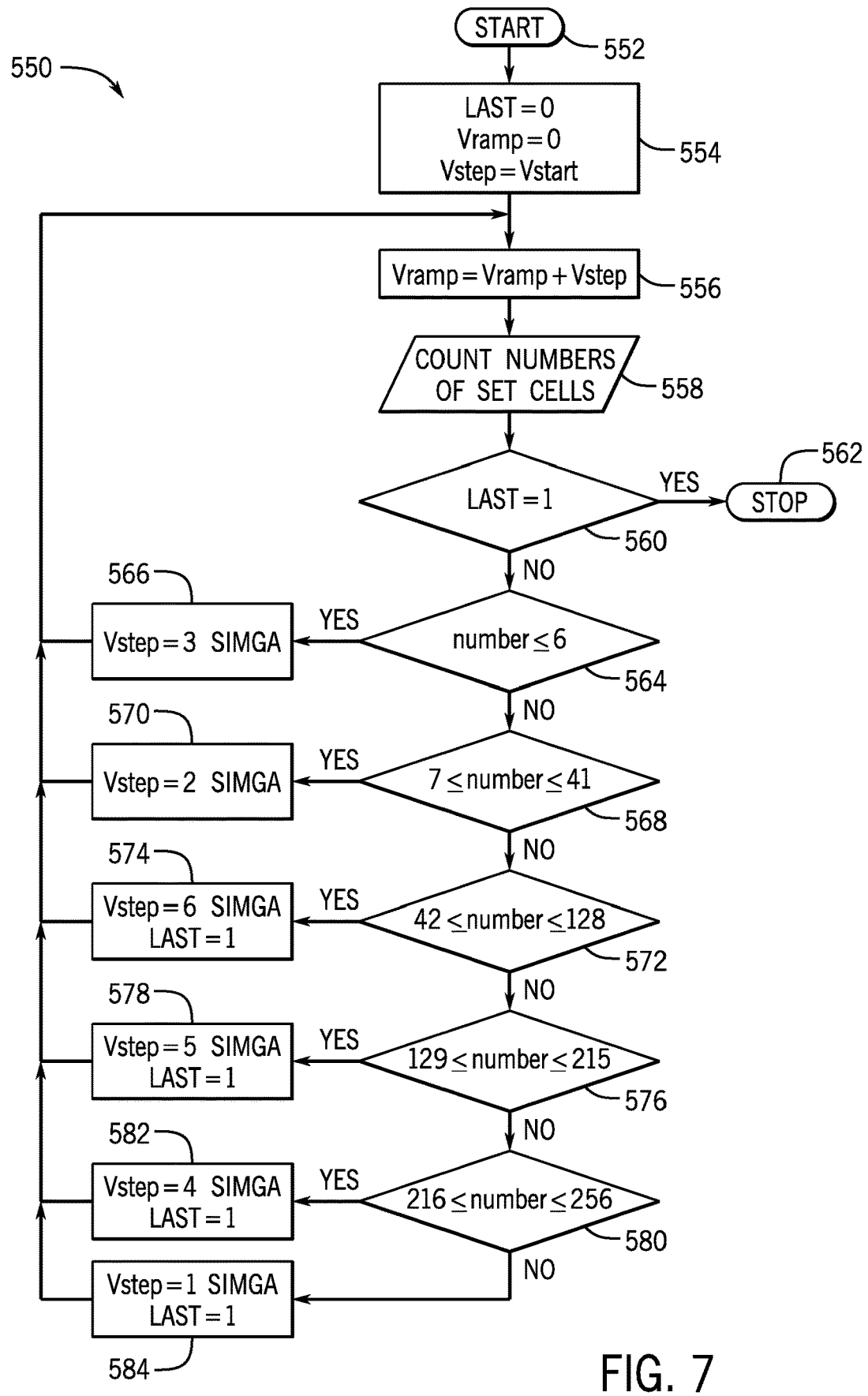
FIG. 7 is a flowchart of a process suitable for adaptively reading data stored in the memory array of FIG.1, according to an embodiment of the present disclosure.

FIG. 7 is a flowchart of an embodiment of a process 550 that may be used to adaptively determine a number of read steps and/or a voltage for the read step, for example, for a 64 bit codeword. The process 600 may be implemented, for example, by the control circuit 122. The process 600, in summary, may divide a SET distribution (e.g., distribution 500) into an approach zone or range and a final step zone or range based, for example, by using the regions 502, 504, 506, 508, 510. The approach zones may be used to apply one or more ramping steps, while the final step area may apply a single and final step, resulting in an adaptive ramping shape (e.g., ramping step 564).

In the depicted example, the process 550 may begin at block 552, and then initialize (block 554) one or more variables. For example, a Last variable representative of whether the process in is a final step area may be initialized to 0, while a Vramp variable representative of a voltage to apply to a step or ramp may also be initialized to zero. A Vstep variable representative of an amount to add to the voltage for each step may also be initialized. For example, the Vstep variable may be initialized to begin at a starting voltage (Vstart) value. In the depicted embodiment, the process 550 may then add (block 556), Vramp to itself plus the value of the Vstep variable. The process 550 may also (block 556) transmit a read voltage having a value of Vramp into the memory cells 102 storing data to be read. For example, the bitlines 104 and the wordlines 106 may be used to transmit the Vramp voltage.

The SET memory cells 102 may then exhibit a switching event representative of the cell storing a logic 1. The process 550 may then count (block 558) the number of memory cells 102 that have been read. The process 550 may then determine (decision 560) if the variable Last is set to 1. If the variable Last is set to 1 (decision 560) the process 500 may then stop (block 562). If the variable Last is not set to 1 (decision 560) the process 500 may then determine (decision 564) if the number of SET cells that exhibited the switching event is less than or equal to 6. The number 6 may have been selected because it falls outside the 3 sigma region 504 for 64 bit codewords. Other numbers may be used based on the size of the codeword, such as 8 for 128 bit codewords, 12 for 256 bit codewords, and so on. The process 550 may then set (block 566) the Vstep value to 3σ and then iterate to block 556. If the number of SET cells that exhibited the switching event is not less than or equal to 6 (decision 564), the process 550 may then determine (decision 568) if the number of SET cells that exhibited the switching event is greater than or equal to 7 and less than or equal to 41. The number 7 and 41 may be chosen because values in this range are outside 2σ Other values may be used based on codeword length.

If the number of SET cells that exhibited the switching event is greater than or equal to 7 and less than or equal to 41 (decision 568) the process 550 may then set (block 570) the Vstep value to 2σ and iterate to block 556. If the number of SET cells that exhibited the switching event is not greater than or equal to 7 and less than or equal to 41 (decision 568) the process 550 may then determine (decision 572) if the number of SET cells that exhibited the switching event is greater than or equal to 42 and less than or equal to 128. The number 42 and 128 may be chosen because values in this range are outside 1σ.

If the number of SET cells that exhibited the switching event is greater than or equal to 42 and less than or equal to 128 (decision 572) the process 550 may then set (block 574) the Vstep value to 6σ, set the Last variable to 1, and iterate to block 556. If the number of SET cells that exhibited the switching event is not greater than or equal to 42 and less than or equal to 128 (decision 572) the process 550 may then determine (decision 576) if the number of SET cells that exhibited the switching event is greater than or equal to 129 and less than or equal to 215. The number 129 and 215 may be chosen because values in this range are inside 1σ.

If the number of SET cells that exhibited the switching event is greater than or equal to 129 and less than or equal to 215 (decision 576) the process 550 may then set (block 578) the Vstep value to 5σ, set the Last variable to 1, and iterate to block 556. If the number of SET cells that exhibited the switching event is not greater than or equal to 129 and less than or equal to 215 (decision 576) the process 550 may then determine (decision 580) if the number of SET cells that exhibited the switching event is greater than or equal to 216 and less than or equal to 256. The number 216 and 256 may be chosen because values in this range are inside 6σ.

If the number of SET cells that exhibited the switching event is greater than or equal to 216 and less than or equal to 256 (decision 580) the process 550 may then set (block 584) the Vstep value to 1σ, set the Last variable to 1, and iterate to block 556. In certain embodiments, the process 550 may utilize a look up table (LUT) or portions of a LUT as shown below with respect to Table 1. The LUT may be used to more quickly determine a voltage to apply for reading the SET memory cells 102 and to determine if further ramping steps are to be used.

TABLE 1

Read Voltages to Use Based on Number of SET Cells Turning On

| Zone | Range of total SET cells that have turned on | Read Voltage STEP | Last Step |
|---|---|---|---|
| Approach | ≤6 | 3 sigma | 0 |
| Approach | [7:41] | 2 sigma | 0 |
| Final Step | [42:128] | 6 sigma | 1 |
| Final Step | [129:215] | 5 sigma | 1 |
| Final Step | [216:256] | 4 sigma | 1 |
| Final Step | >256 | 1 sigma | 1 |

As noted earlier, a first start voltage may be applied, which may then result in one or more SET cells turning on. Table 1 may then be consulted, for example, by looking at the numeric ranges of the second column, to determine a new voltage to apply (e.g., voltage stored the third column), and also to determine if more ramping steps are to be provided (e.g., via the fourth column). By then applying the voltage from the third column, a new set of cells may be read and the total number of cells that have been read may then be used to determine if more ramping steps are to be used to read remaining SET cells. Once all the SET cells are read (e.g., after applying the Final Step voltage), all remaining unread memory cells 102 may be derived as being RESET memory cells.

It is to be understood that the values in decisions 564, 568, 572, 576, 580, and/or Table 1 above, are for example only. Other values may be used. For example, given a codeword having N bits, N may be divided into the regions 502, 504, 506, 508, 510 assuming, for example, a normal distribution for the encoded data (and/or for balanced data, e.g., data having an approximately equal logic 1 count to logic 0 count). In other embodiments, a manufacturer may perform statistical analysis on the read behavior of the memory cells of one or more memory devices 100 and then arrive at a distribution (e.g., distribution 500) for the memory device 100 and store the resulting analysis as a LUT (e.g., Table 1).

In one embodiment, boundaries (6, 41, 128, and 215) between the ranges have been chosen considering a gaussian distribution of 256 SET cells, for certain mean values. For example, if the mean value was at 4.4V and sigma=0.85 mV. The values may correspond respectively to Mean-2sigma, Mean-1sigma, Mean, and Mean+1sigma of the SET distribution, as summarized in the table below.

TABLE 2

Example only table to illustrate Vth values for mean of 4.4 V and sigma = 0.85 mV with 256 SET cells.

|  | Vth | Count |
|---|---|---|
| Mean – 2sigma | 4.230 | 6 |
| Mean – 1sigma | 4.315 | 41 |
| Mean | 4.400 | 128 |
| Mean + 1sigma | 4.485 | 215 |

Figure 8:
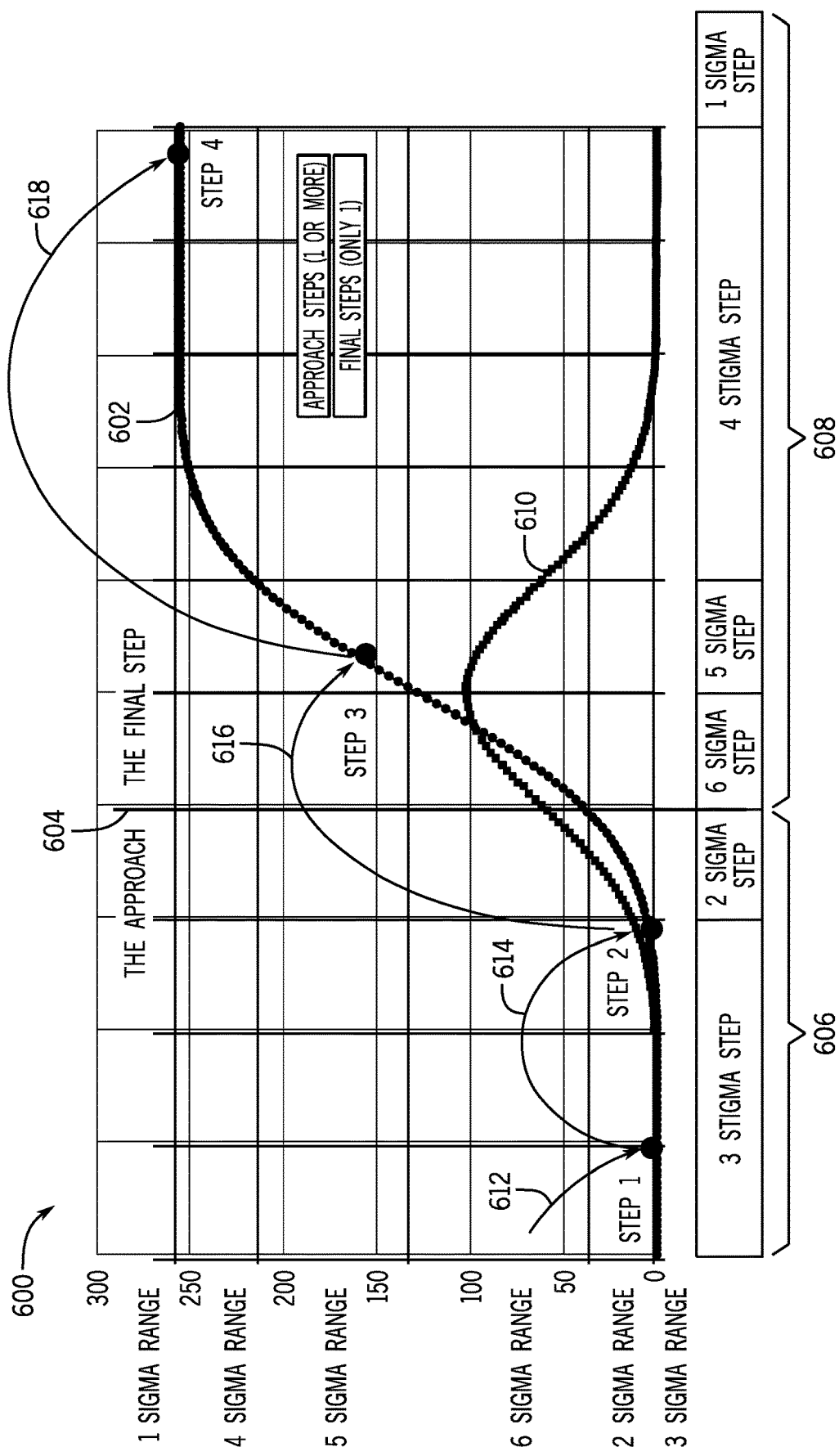
FIG. 8 is a graph of electrical voltages steps applied to the memory array of FIG. 1 to read data, according to an embodiment of the present disclosure.

It may be beneficial to illustrate a selection of read voltage steps that may be provided by using the process 550 describe above. Turning now to FIG. 8, the figure includes a graph 600 illustrating an embodiment of total curve 602 that may be used to read SET memory cells 102. The graph 600 includes a read voltage in the X axis and a number of SET memory cells in the Y axis. The Y axis is also shown to include sigma ranges 1 through 6 for the total count curve 602, and the X axis is also shown to include sigma step ranges 1 through 6 for the read voltage. In the depicted embodiment, a dividing line 604 divides the graph 600 into an approach range or region 606 and a final step range or region 608. In certain embodiments, the dividing line 604 may be equal to $-2\sigma$ for a distribution 610 (e.g., equivalent to the distribution 500). In a first step 612, a first read voltage may be applied. For example, a Vstart read voltage may be applied to the memory cells 102 to cause one or more SET memory cells 102 to exhibit a switching event representative of the cell(s) storing a logic 1.

The number of switched cells 102 may then be counted, if the number falls inside of the approach range 606 (e.g., as listed in Table 1 and described in FIG. 7), a second step 614 may then be taken. In the depicted embodiment, the second step 614 may be applied at a 3 sigma voltage and the new total for SET memory cells 102 that have exhibited the switching event may be counted. The figure shows the total count as being inside of the approach region 606 and thus a third step 616 may apply a voltage, such as a 2 sigma voltage. The 2 sigma voltage may result in a total count of switched SET memory cells having a value that falls outside of the approach region 606 and inside of the final step region 608. Accordingly, a single final step 618 may be applied, for example, at a 5 sigma voltage. The final step 618 may the result in the discovery of all SET memory cells 102, and the remaining memory cells 102 may be assumed to be RESET cells. By adaptively determining the number of total read steps and voltages for each read step to apply, the techniques described herein may more efficiently read data stored in the memory cells 102.

As mentioned earlier, the techniques described herein may also enable an adaptive time between ramping steps. That is, instead of using a fixed time for a duration of 454, 456, 458, 460, steps may have a time duration that varies, such as steps 466, 468, 470. In one embodiment, the time duration may depend on a number of memory cells 102 that are sensed in parallel, for example, from the same wordline 106. A greater number of sensed memory cells 106 may introduce a reciprocal disturb and may thus lead to a longer time duration for the step, e.g., a longer sensing time. After sensing the number of activated memory cells 102 (e.g., SET cells) for a first step, the control circuit 122 may then adaptively decide on a time duration for a second step, count a second number of activated memory cells 102, and so on. The adaptive read techniques may also include fixed and/or variable latency suitable for handling various data scenarios (e.g., best case, typical case, worst case). Accordingly, a more efficient and faster converging self-referenced read operation may be provided, having a lower raw bit error rate (RBER).

Figure 9:
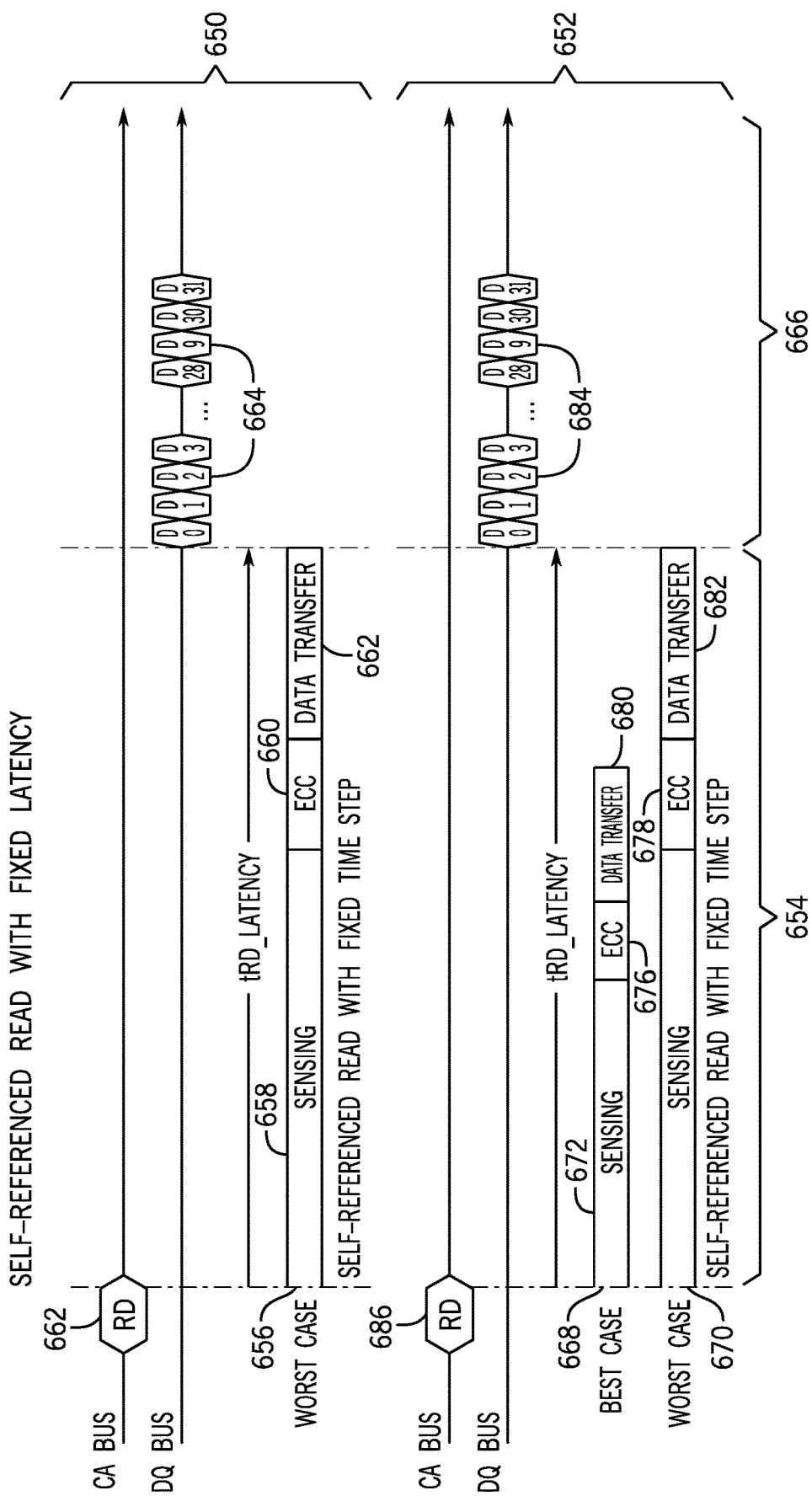
FIG. 9 is a timing diagram illustrating fixed latency data transfers for certain systems that interface with the memory device of FIG. 1 that may include fixed latency communications, according to an embodiment of the present disclosure.

FIG. 9 includes timing diagrams illustrating an embodiment of fixed latency data transfers for certain systems that may interface with the memory device 100 and that may use fixed latency communications. In the depicted embodiment, a first timing diagram 650 illustrates a worst (and also a best) case fixed latency time for steps (e.g. steps 454, 456, 458 and 460) that have a fixed time duration. A second timing diagram 652 illustrates a fixed latency time for steps (e.g., steps 466, 468, or 470) that have adaptive (e.g. varying) time duration. In the depicted embodiment, all steps in the first timing diagram 650 have approximately the same time duration 654. A fixed duration step 656 is shown to include a sensing time 658, an error correction (ecc time) 660, and a data transfer time 662. In use, the memory device 100 may issue a read command at time 662 on a command bus. The control circuit 122 may then respond to the read command by sensing data stored in the memory cells, e.g., by sending a voltage to activate SET memory cells 102 storing, for example, a logic 1. The sensing operation may transmit a staircase shaped voltage during the sensing time 658, apply error correction to sensed data during the ecc time 660, and subsequently transfer data during the data transfer time 662. Data values 664 (e.g., 32 bits of data) may then be placed on a data bus at time 666.

The timing diagram 652, while using adaptive steps 668, 670, is shown as also using the same fixed latency time, e.g., time 654 for communications. Accordingly, while the best time step 668 and the worst time step 670 are illustrated as having, for example, different sensing times 672, 674, different ecc times 676, 678, and/or different transfer times 680, 682, the adaptive steps 668, 670 both wait for the end of the latency time 654 before transmitting data 684 (e.g., 32 bits of data). That is, a read command is initiated at time 686, which is illustrated to be the same time as time 662, and regardless of the timing for the adaptive step used (e.g., steps 668 and/or 670), data 684 is provided at the same time 666 for both steps 668, 670. Accordingly, the techniques described herein may utilize data not valid (DNV) flags and/or ready buffer (R/B) signals to reduce data read times for certain read steps.

Figure 10:
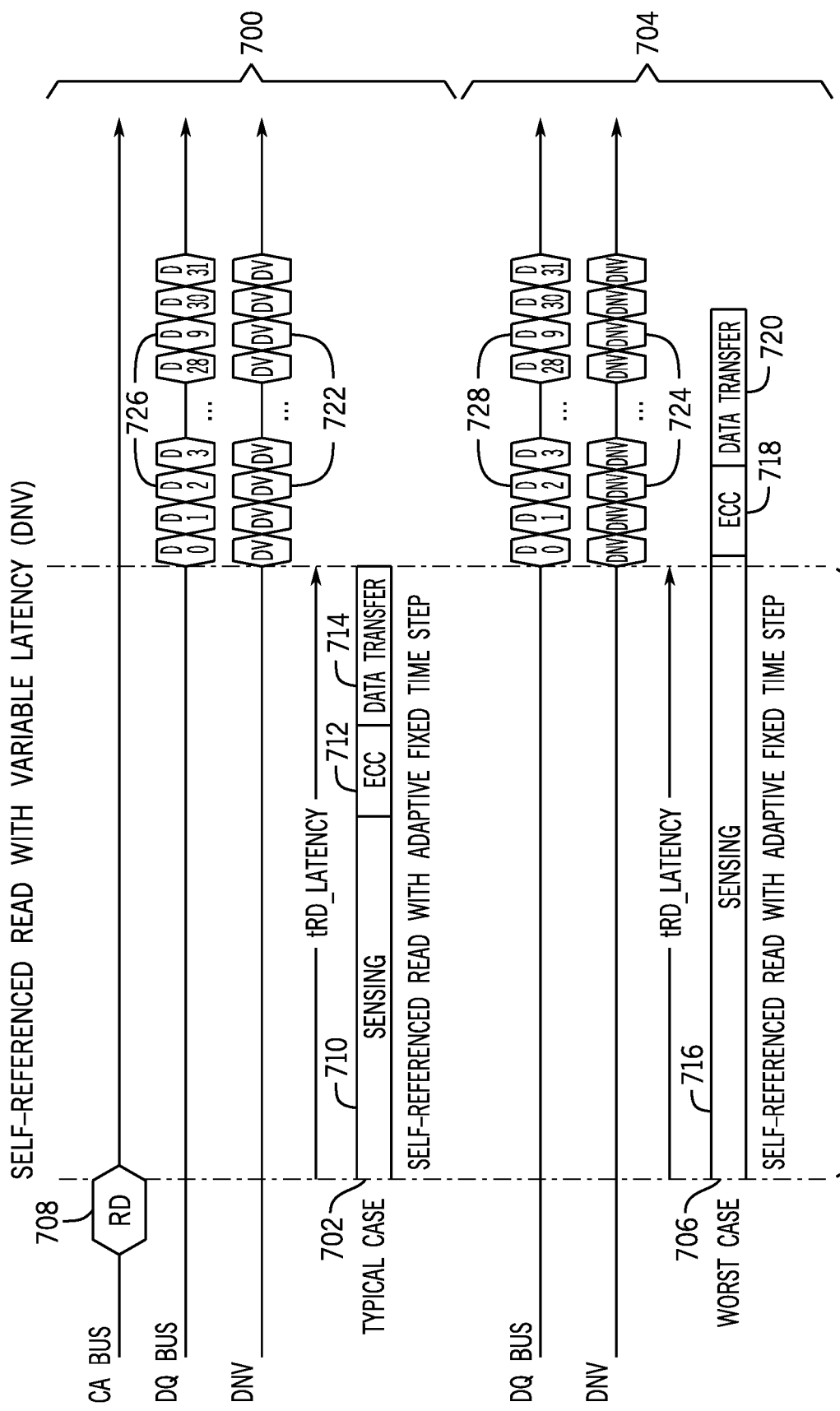
FIG. 10 is a timing diagram illustrating a typical case read step and a worst case read step, according to an embodiment of the present disclosure.

FIG. 10 includes timing diagrams having embodiments of a typical case read step and a worst case read step. More specifically, a timing diagram 700 illustrates a typical read step 702 and a timing diagram 704 illustrates a worst case read step 706. The fixed latency time 654 of FIG. 9 is also shown for comparison. In the embodiment shown, a read command is issued at time 708. The control circuit 122 may then issue the typical case read step 702 in response to the read command. The typical read step 702 may include a sensing time 710, an ecc time 712, and a data transfer time 714. The typical case read step 702 may complete its data transfer time on or before the end of the fixed latency 654. However, the worst case read step 706 may include a longer sensing time 716, ecc time 718, and/or data transfer time 720 when compared to the typical case read step 702. Accordingly, the typical read step 702 may be ready for data communications before the worst case read step 706.

To improve data read efficiency, the techniques described herein may use data valid (DV) flags 722 and/or data not valid (DNV) flags 724. For example, at the end of a certain time period (e.g., at the fixed latency period 654, or 10, 20, 30, 50 nanoseconds before the end of the fixed latency period 654), the DV flags 722 may be transmitted on a DNV bus by the control circuit 122 to denote that data 726 (e.g., 32 bits) now placed on the data bus is valid. If the time period (e.g., time 654) expires and data is not ready to be processed, then the control circuit 122 may transmit DNV flags 724 on the DNV bus to denote data 728 is not ready for processing. Accordingly, read steps of differing time durations may more efficiently transfer data when the data is ready for processing.

Figure 11:
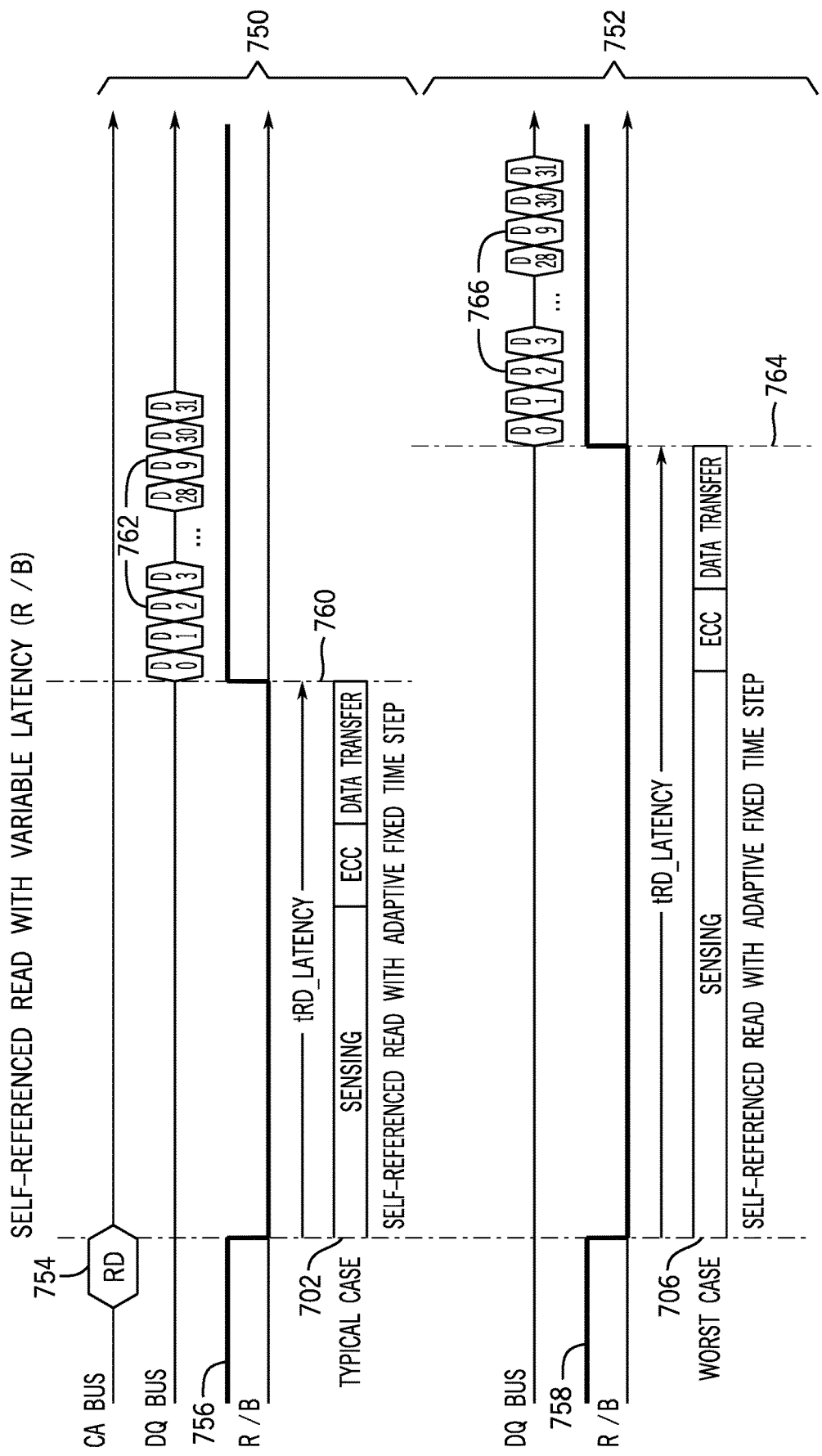
FIG. 11 is a timing diagram having embodiments of a typical case read step and a worst case read step that may use a ready busy signal, according to an embodiment of the present disclosure.

FIG. 11 includes timing diagrams having embodiments of a typical case read step and a worst case read step that may use a ready busy (R/B) signaling. In the depicted embodiment, a timing diagram 750 includes the typical case read step 702 and a timing diagram 752 includes the worst case read step 706. In the depicted embodiment, a read command may arrive via the command bus at time 754. Accordingly, a ready busy signal 756 for the typical case read step 702 is depicted as having a logic low value at time 754 to denote that data is not ready to be read. Likewise, a ready busy signal 758 for the worst case read step 706 is also depicted as having a logic low value at time 754 denoting that data is not ready to be read.

The typical case read step 702 is illustrated as ending at time 760. Accordingly, the ready busy signal 756 may now be set to a logic high at time 760, denoting that data 762 placed on the data bus is now ready for processing. Likewise, the ready busy signal 758 may be set to a logic high at time 764, denoting that data 766 placed on the data bus is now ready for processing. The control circuit 122 and/or external systems coupled to the memory device 100 may then use the ready busy signals, e.g., signals 756, 758, to read and process data, e.g., data 762, 764, when a read step resulted in valid data being placed on the data bus. By using ready busy signals, the techniques described herein may optimize timings of reads.

Figure 12:
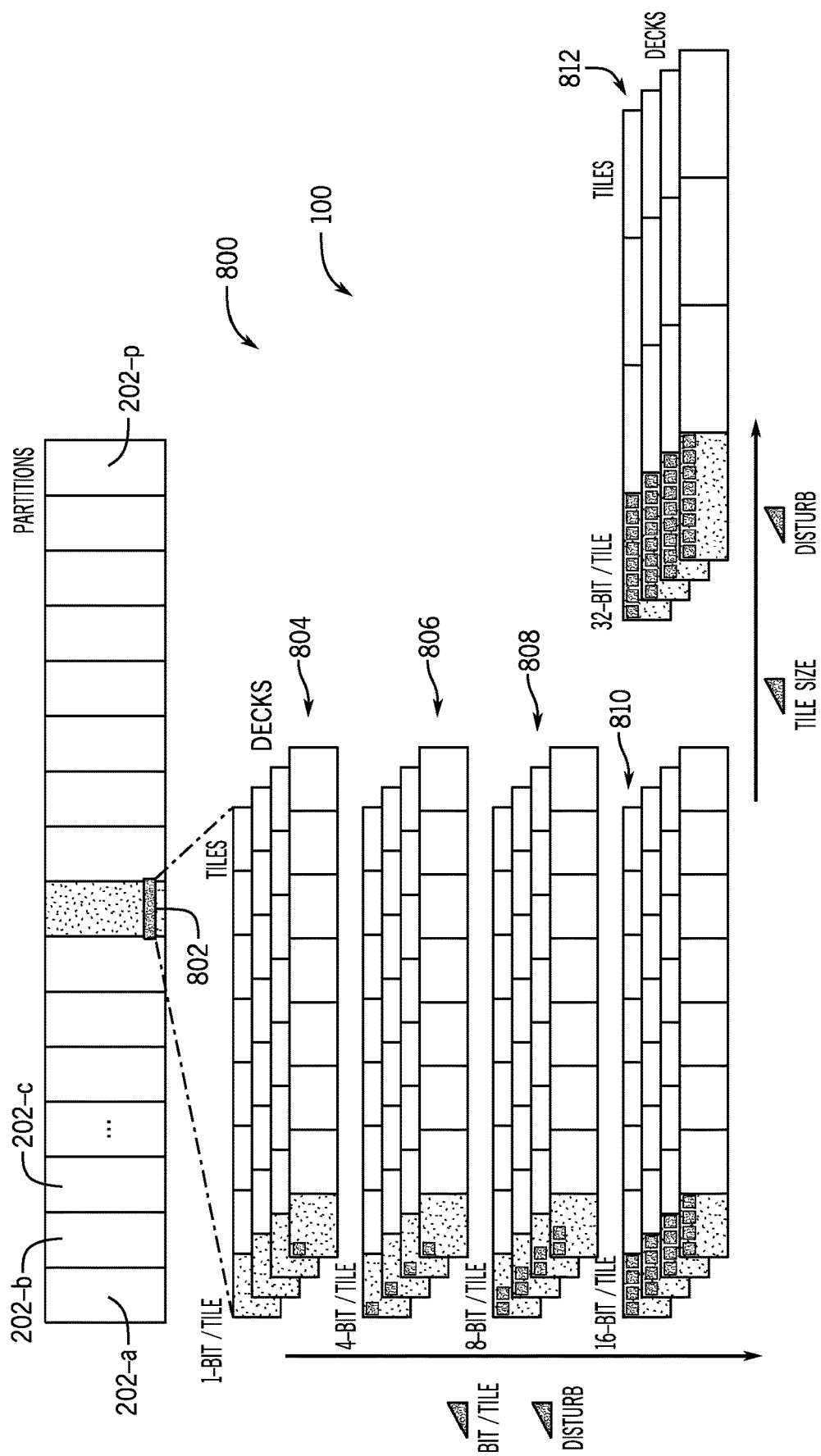
FIG. 12 is a block diagram illustrating a partition architecture for the memory device of FIG. 1, according to an embodiment of the present disclosure.

As mentioned earlier, partitions 202 may be used, for example, to more efficiently read and write data in parallel. However, one side effect of using partitions 202 may include introducing reciprocal disturbs when sensing data. The techniques described herein may adaptively adjust a read time for steps based on a number of cells activated during read operations. Turning now to FIG. 12, the figure is a block diagram illustrating an embodiment of a partition architecture 800 that may result in certain "disturbs" based on parallel reads or writes.

In the depicted embodiment, multiple partitions 202 are shown, for example, included in the memory device 100. Each partition 202 may include multiple tiles 802 disposed on various layers or decks. Bit counts per tile 802 may vary depending, for example, on desired applications. That is, a memory device 100 may be provided to have a certain bit count per tile. Likewise, tiles 802 may be manufactured at various tile sizes. The figure illustrates 1 bit per tile (bit/tile) tiles 804, 4 bit/tile tiles 806, 8 bit/tile tiles 808, 16 bit/tile tiles 810, and 32 bit/tile tiles 812. It is to be noted that other bit per tiles and/or tile sizes may be used.

As the bit per tile count increases and/or as the tile size increases, "disturbs" may be introduced. That is, as memory cells 102 are sensed in parallel in the same wordline 106, nearby memory cells 102 may be "disturbed" by the voltage introduced on the wordline 106, and a greater overall read time may be required when compared to non-parallel reads. For example, a memory cell 102 may switch and inject current into the wordline 106, and the next memory cell 102 may switch at a later time than expected due to changing RC values. The greater the number of memory cells 102 that may be sensed in parallel from the same wordline 106, the higher the sensing time (e.g., sensing times 672, 674, 710, 716).

The techniques described herein may use adaptive adjustment of time duration for each read step (e.g., steps 466, 468, 470), for example, based on a count of the number of steps that have activated. In certain embodiments, the time duration for read steps may be more quickly derived by the use of a lookup table (LUT) that may include a first column having a count of SET cells that have activated and a second column that may include a time to apply voltage for the next read step in the read staircase. An example table is shown below.

TABLE 3

Time Adjustment Based on Number of SET Cells Turning On

| Count of SET Cells Activated | Next Time Step |
|---|---|
| Count ≤ 8 | 3 nanoseconds (ns) |
| 8 < Count ≤ 16 | 5 ns |
| 16 < Count ≤ 32 | 10 ns |
| 32 < Count ≤ 64 | 20 ns |
| 64 < Count ≤ 72 | 50 ns |
| 72 < Count ≤ 128 | 100 ns |

Table 3 illustrates some example values that may be used for 128 bit codewords. In use, the control circuit 122 may use a counter-based circuit to count a number of SET memory cells 102 that activate after a first step (e.g., step 466), and then use Table 3 above to determine a time for a second step (e.g., step 468), e.g. via comparator circuit. The time for a third step, fourth step, fifth step, sixth step, and so on, may then be determined based on a count of SET memory cells that have activated in the previous step. Indeed, an adaptive timing for read steps may be provided via lookup tables. An example process using lookup tables is described with respect to FIG. 13.

Figure 13:
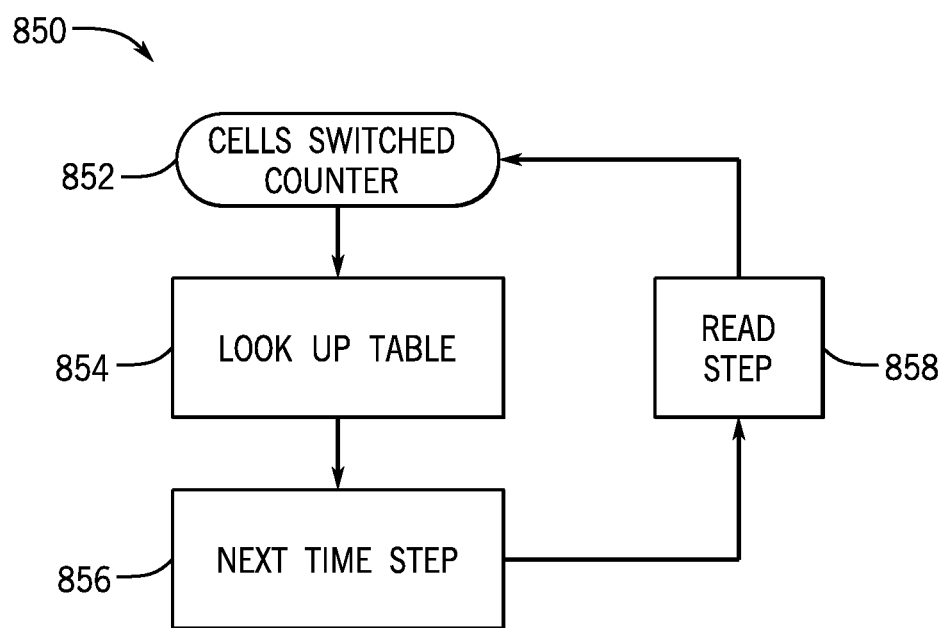
FIG. 13 a flowchart of a process that may be used to adaptively determine a time interval for a read step, according to an embodiment of the present disclosure.

FIG. 13 is a flowchart of a process 850 that may be used to adaptively determine a time interval for a read step, such as adaptive steps 466, 468, 470. The process 850 may be implemented by the control circuit 122. In the depicted embodiment, the process 850 may apply a starting voltage (e.g., starting voltage step) and then count (block 852) a number of SET memory cells 102 that may have activated. The SET memory cells 102 may be storing data using, for example, the encoding process described with respect to FIG. 4. The process 850 may then use a lookup table (LUT) 854, such as Table 3 described above, to determine a value (block 856) for a time duration to use during the next step in the ramp (e.g., staircase ramp). That is, the process 850 may determine a time duration for applying voltage in the next step of the staircase based on the current count of activated SET cells. The process 850 may then apply the time duration to read (block 858) the next step, for example, by applying a voltage at a certain value and for the desired time duration. In certain embodiments, the applied voltage value may be determined using process 550 described with respect to FIG. 7.

The process 850 may then iterate back to block 852 and count a number of SET memory cells 102 that may have been activated after completion of the current read step, and if there are more steps to apply, continue using the LUT 854. In some embodiments, the number of steps to use for reading data may be determined using process 550 described with respect to FIG. 7. By iteratively applying voltage at a desired time duration, counting the resulting activated SET memory cells, and determining a timing duration for the next read step via the LUT 854, the techniques described herein may adaptively determine timings for the next step and thus more efficiently read data from the memory array 112. Timings for the next step, e.g., timings stored in the second column of Table 3, may be derived based on statistical analysis. For example, a manufacturer of the memory device 100 may test one or more of the memory devices 100 to empirically determine a more efficient time value for example, for reads at various codeword sizes.

It is to be noted that the lookup tables described above may be created based on memory technology, usage model (e.g., used in servers storing data long term, short term, and so on), application (e.g., portable device memory, server memory, desktop computer memory, and the like), and may be updated during the lifetime of the memory device. It is to be noted that the lookup tables (e.g., Tables 1 and 3) described above may be created based on memory technology, usage model (e.g., used in servers storing data long term, short term, and so on), application (e.g., portable device memory, server memory, desktop computer memory, and the like), and may be updated during the lifetime of the memory device. Other steps durations in the lookup tables (e.g., Tables 1 and 3) may also include non monotonous trends. Likewise, parallel access within one tile may be used, and a longer resistive-capacitive (RC) recovery time may be accounted for as when tiles are access in parallel. For example, it may be expected that an increasing number of snapped cells (at each snap there is a sudden current increase and a corresponding voltage drop) may occur.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function]. . ." or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
a memory array comprising a plurality of memory cells;
a control circuit operatively coupled to the memory array, the control circuit configured to:
receive a read request for data;
apply a first voltage to the memory array based on the read request, wherein a first set of memory cells of the plurality of memory cells is configured to be read as storing a first logic value based on the first voltage;
count a total number of the plurality of memory cells that have switched to an active read state based on the first voltage;
apply a second voltage to the memory array based on the total number, wherein a second set of memory cells included in the plurality of memory cells is configured to be read as storing the first logic value based on the second voltage; and
return the data based at least on bits stored in the first and the second set of memory cells.

2. The memory device of claim 1, wherein the control circuit is configured to apply the second voltage by determining if the total number is inside of an approach zone of values or a final step zone of values.

3. The memory device of claim 2, wherein the control circuit is configured to use a lookup table (LUT) in determining if the total number is inside of the approach range of values or the final step range of values.

4. The memory device of claim 2, wherein the control circuit is configured to apply one or more voltage steps if the total number is inside of the approach range of values and apply a single voltage step if the total number is inside of the final step range of values.

5. The memory device of claim 2, wherein the approach range of values, the final step range of values, or a combination thereof, are divided into one or more statistical areas.

6. The memory device of claim 5, wherein the one or more statistical areas comprise a 1 sigma, a 2 sigma, a 3 sigma, a 4 sigma, a 5 sigma, a 6 sigma, or a combination thereof.

7. The device of claim 1, wherein the control circuit is configured to apply the first voltage for a first time duration and to apply the second voltage for a second time duration, and wherein the first time duration is different than the second time duration.

8. The device of claim 1, wherein the bits comprise encoded data having a weight range of between 40% and 70%.

9. The device of claim 1, wherein the first logic value comprises a logic 1.

10. The memory device of claim 1, wherein the first and the second voltages are included in a voltage staircase shape.

11. A method, comprising:
receiving, at a control circuit included in a memory device, a read request for data;

applying a first voltage to a memory array of the memory device based on the read request, wherein a first set of memory cells of a plurality of memory cells of the memory array is configured to be read as storing a first logic value based on the first voltage;

counting a total number of the plurality of memory cells that have switched to an active read state based on the first voltage;

applying a second voltage to the memory array based on the total number, wherein a second set of memory cells of the plurality of memory cells is configured to be read as storing the first logic value based on the second voltage; and returning the data based at least on bits stored in the first and the second set of memory cells.

12. The method of claim 11, wherein applying the second voltage comprises determining if the total number is inside of an approach range of values or a final step range of values, and wherein the approach range of values, the final step range of values, or a combination thereof, are divided into one or more statistical areas.

13. The method of claim 12, comprising executing one or more voltage steps if the total number is inside of the approach range of values and executing a single voltage step if the total number is inside of the final step range of values.

14. The method of claim 11, comprising encoding the data as encoded data and storing the encoded data in the memory array before receiving the read request, and wherein returning the data comprises decoding the encoded data.

15. The method of claim 11, wherein applying the first voltage comprises applying the first voltage for a first time duration and wherein applying the second voltage comprises applying the second voltage for a second time duration, and wherein the first time duration is different than the second time duration.

16. A memory device, comprising:
a memory array comprising a plurality of memory cells;
a control circuit operatively coupled to the memory array, the control circuit configured to:
receive a read request for data;
apply a first voltage to the memory array based on the read request, wherein a first set of memory cells of the plurality of memory cells is configured to be read as storing a first logic value based on the first voltage;
count a total number of the plurality of memory cells that have switched to an active read state based on the first voltage;
determine if the total number is inside of an approach range of values, a final step range of values, or a combination thereof; and
apply one or more voltage steps if the total number is inside of the approach range of values and apply a single voltage step if the total number is inside of the final step range of values to return the data.

17. The memory device of claim 16, wherein the approach range of values, the final step range of values, or a combination thereof, are divided into one or more statistical areas comprising a 1 sigma, a 2 sigma, a 3 sigma, a 4 sigma, a 5 sigma, a 6 sigma, or a combination thereof.

18. The memory device of claim 17, wherein the approach range of values is divided into a first statistical area comprising the 2 sigma, the 3 sigma, or a combination thereof, and wherein the final step range of values is divided into a second statistical area comprising the 1 sigma, the 4 sigma, the 5 sigma, the 6 sigma, or a combination thereof.

19. The memory device of claim 16, wherein the control circuit is configured to use a lookup table (LUT) in determining if the total number is inside of the approach range of values or the final step range of values.

20. The memory device of claim 16, wherein the control circuit is configured to encode the data as encoded data having a weight between 40% and 70% and to store the encoded data in the memory array before receiving the read request, and wherein the control circuit is configured to return the data by decoding the encoded data.

* * * * *

UNITED STATES PATENT AND TRADEMARK OFFICE
CERTIFICATE OF CORRECTION

Page 1 of 2

PATENT NO. : 11,538,522 B1
APPLICATION NO. : 17/364067
DATED : December 27, 2022
INVENTOR(S) : Graziano Mirichigni et al.

It is certified that error appears in the above-identified patent and that said Letters Patent is hereby corrected as shown below:

In the Drawings

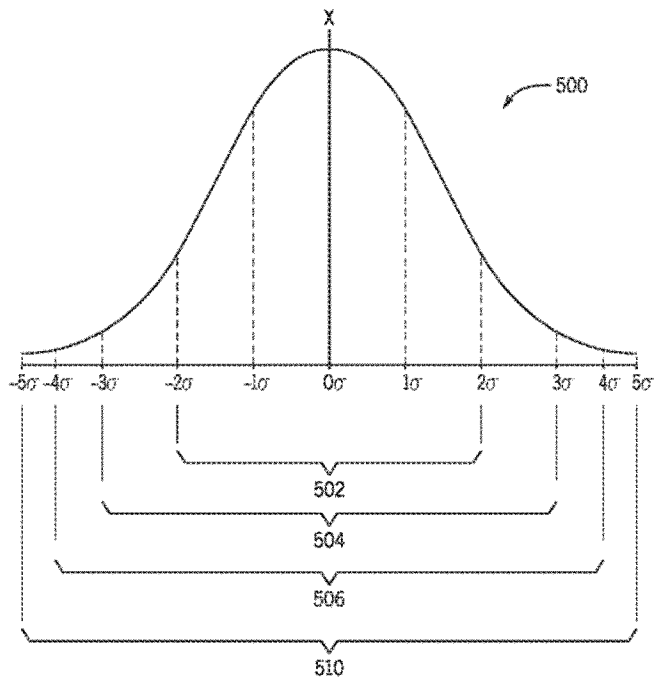

In Fig. 6, Sheet 6 of 13, delete "        FIG. 6        " and insert

Signed and Sealed this
Thirtieth Day of May, 2023

Katherine Kelly Vidal
*Director of the United States Patent and Trademark Office*

CERTIFICATE OF CORRECTION (continued)
U.S. Pat. No. 11,538,522 B1

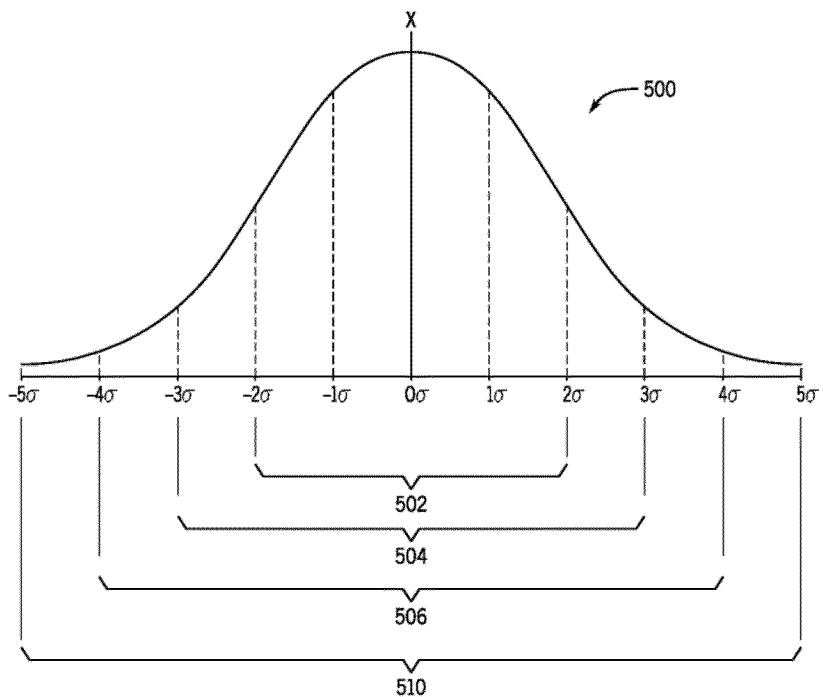

-- FIG. 6 --, therefor.

In Fig. 8, Sheet 8 of 13, delete

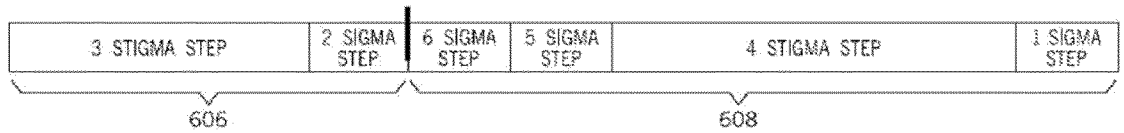

" FIG. 8 " and

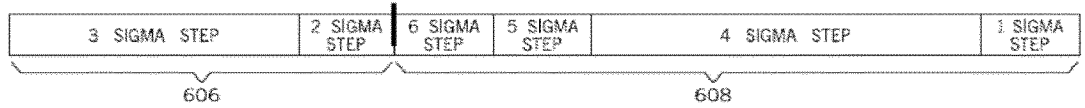

insert -- FIG. 8 --, therefor.